United States Patent
Scheifers et al.

(10) Patent No.: US 6,858,660 B1
(45) Date of Patent: Feb. 22, 2005

(54) METHOD AND CHEMISTRY FOR AUTOMATIC SELF-JOINING OF FAILURES IN POLYMERS

(75) Inventors: Steven M. Scheifers, Hoffman Estates, IL (US); Andrew F Skipor, West Chicago, IL (US); Aaron Brown, Evanston, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/631,374

(22) Filed: Jul. 31, 2003

(51) Int. Cl.[7] ............................ C08K 9/00; B32B 15/02
(52) U.S. Cl. ........................ 523/200; 523/201; 523/211; 428/402.21
(58) Field of Search ................................. 523/200, 201, 523/211; 525/200, 201

(56) References Cited

U.S. PATENT DOCUMENTS

| | | | | |
|---|---|---|---|---|
| 4,960,465 A | * | 10/1990 | Arfaei | ........................ 106/724 |
| 5,326,830 A | * | 7/1994 | Aharoni | ...................... 525/418 |
| 6,075,072 A | * | 6/2000 | Guilbert et al. | ............. 523/200 |
| 6,518,330 B2 | | 2/2003 | White et al. | |

OTHER PUBLICATIONS

Xiangxu Chen, et al., "*A Thermally Re–mendable Cross–Linked Polymeric Material*", Science; vol. 295, Issue 5560, Mar. 1, 2002, pp. 1698–1702.

S. R. White, et al., "*Nature, Automatic healing of polymer composites*", vol. 409, Feb. 2001, www.nature.com; pp. 794–797.

* cited by examiner

*Primary Examiner*—James J. Seidleck
*Assistant Examiner*—Olga Asinovsky

(57) ABSTRACT

A self-joining polymer composition, comprising a polymer, a plurality of amine pendant groups attached to the polymer and a plurality of microcapsules of flowable polymerizable material dispersed in the polymer where the microcapsules of flowable polymerizable material including microcapsules and flowable polymerizable material inside the microcapsules. The microcapsules are effective for rupturing with a failure of the polymer so the flowable polymerizable material cross-links with the reactable pendant groups upon rupture of the microcapsules.

19 Claims, 4 Drawing Sheets

METHOD AND CHEMISTRY FOR AUTOMATIC SELF-JOINING OF FAILURES IN POLYMERS

FIELD OF THE INVENTION

This invention relates generally to repair of failures in polymers. More specifically this invention relates to the chemistry to form cross-links within a material failure to chemically bond opposing faces of the failure.

BACKGROUND OF THE INVENTION

Polymeric materials tend to fail or degrade due to mechanical fatigue, mechanical impact, oxidative aging due to radiation or impurities, thermal fatigue, chemical degradation, or a combination of these processes. The degradation can lead to embrittlement of the polymer, among other adverse effects. The embrittlement and associated cracking can advance to the point of product failure, which creates replacement costs. Mechanical fatigue and mechanical stress, such as that caused by dropping the object, can also lead to cracks that eventually cause failure. Thermoplastic and thermoset polymer systems used in products can be particularly susceptible to these failure modalities.

This problem is a great concern because of the widespread and intensive use in modern society of polymers in product components. For instance, polymers have a significant importance and presence in the electronics industry. Examples of applications include printed circuit board (PCB) laminates, housings, enclosures, adhesives, die attach, component packaging, and organic semi-conductors. In addition to the above-mentioned failure modes, other degradation processes, such as redox reactions or chemical diffusion, can be expected in organic semi-conductors and in electrically conductive polymers (which degrade their characteristics). Polymeric based paints are also subject to cracking due to environmental exposure causing degradation. Any polymer components used in the structure of equipment, such as airplanes or trains will be subject to long term degradation described above.

Traditional approaches to increasing the reliability of polymeric-based components and products have included a focus on suitable design enhancements and the use of incrementally improved plastics. Recently, a significant increase in the availability of so-called "smart" materials has occurred, which relates to materials that can sense impending failure and facilitate appropriate corrective measures to prevent extensive damage. Alternatively, if the damage has already occurred, some new material systems can purportedly self-heal the damaged structure. See, e.g., Chen, et al., "A Thermally Re-Mendable Cross-Linked Polymeric Material," Science, Vol. 295, March 2002, pp. 1698–1702.

One recently developed process intended to impart self-healing capability to a polymer involves the incorporation of microcapsules containing a healing agent in a polymer matrix. White, S. R., et al., Nature, "Autonomic Healing of Polymer Composites," 409, 794–797 (2001). The healing agent enclosed in the microcapsules is dicyclopentadiene (DCPD). A ruthenium polymerization agent, corresponding to CAS No. 172222-30-9, is dispersed in the polymer matrix. The healing agent is functionally active in the presence of moisture and air (oxygen source). When a fracture occurring in the polymer matrix propagates in close proximity of the microcapsules, the associated stresses caused by the fracture rupture the microcapsules. As a consequence, the healing agent is released from the ruptured microcapsules and contacts the fracture surfaces. The healing agent also comes into contact with a polymerization agent dispersed in the polymer matrix to the extent the dispersed polymerization agent is located in the direct vicinity of the fracture and released healing agent. When the polymerization agent contacts the self-healing agent, the healing agent is polymerized, resulting in filling of the crack planes of the fracture. This filling arrests fracture propagation and reduces the compliance of the post-fractured matrix material.

U.S. Pat. No. 6,518,330 B2 by S. R. White et al., describes a self healing polymer material, which relies upon rupture of microcapsules on contact with a fracture surface exposing a polymerizer to a catalyst. The reacting material within the crack fills the crack and adheres the crack faces together.

It is desirable, therefore, to provide a method for automatic repair of polymer failures that overcomes these and other disadvantages.

SUMMARY OF THE INVENTION

One aspect of the present invention provides a self-joining polymer composition, comprising a polymer, a plurality of amine pendant groups attached to the polymer and a plurality of microcapsules of flowable polymerizable material dispersed in the polymer where the microcapsules of flowable polymerizable material include microcapsules and flowable polymerizable material inside the microcapsules. The microcapsules are effective for rupturing with a failure of the polymer and the flowable polymerizable material cross-links with the reactable pendant groups upon rupture of the microcapsules.

Another aspect of the present invention is a method for healing a failure in a composite member, where the method includes providing a composite member comprising a polymer, a plurality of reactable pendant groups attached to the polymer, and a plurality of microcapsules containing a flowable polymerizing agent dispersed throughout the polymer. The method also includes rupturing at least one of the plurality of microcapsules responsive to a failure in a region of the composite member. The method further provides releasing the flowable polymerizing agent responsive to the rupturing and cross-linking the flowable polymerizing agent with the plurality of reactable pendant groups in the failure region.

A third aspect of the present invention is an article of manufacture comprising a self-joining polymer composition, where the self-joining polymer composition comprises a polymer, a plurality of reactable pendant groups attached to the polymer and a plurality of microcapsules containing a flowable polymerizable material dispersed in the polymer, the microcapsules effective for rupturing with a failure of the polymer wherein the flowable polymerizable material cross-links with the reactable pendant groups to join the failure.

The foregoing device and method as well as features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

The present invention is illustrated by way of example and not limitation in the accompanying figures, in which like references indicate similar elements, and in which.

DETAILED DESCRIPTION OF THE DRAWINGS

The present description relates to an exemplary embodiment of this invention and examples of other embodiments.

Figure 1:
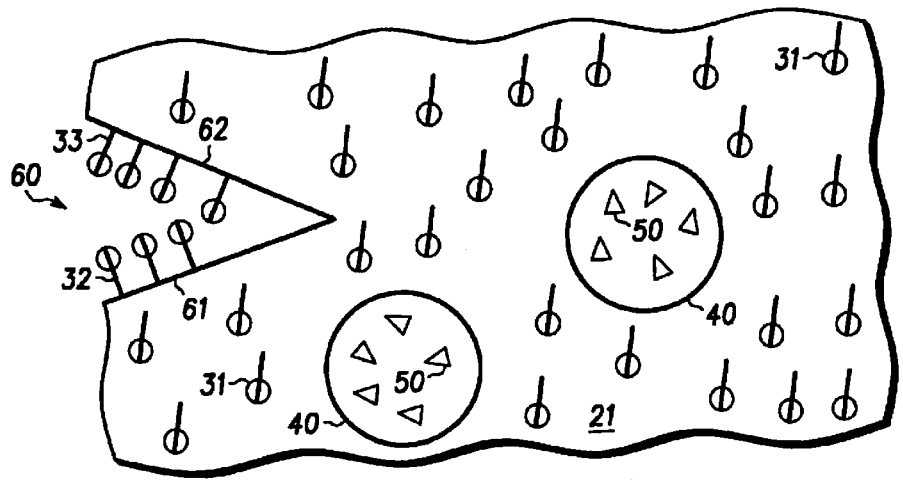
FIGS. 1 and 2 illustrate schematically, a material with a failure at two stages of propagation in accordance with various embodiments of the invention.

FIG. 1 illustrates schematically, a self-joining polymer composition 20 comprised of a polymer 21, which has a plurality of amine pendant groups 31 and a plurality of microcapsules 40 containing flowable polymerizable material 50 dispersed throughout the polymer 21. The flowable polymerizable material 50 can be formed from short and long chain dianhydrides and mixtures thereof. The polymer 21 may be epoxies, thermoset, thermoplastic, elastomeric, and mixtures thereof. In FIG. 1, a failure 60 is illustrated as the failure begins to propagate into the self-joining polymer composition 20. As used herein, a failure refers to a crack or a loss of functionality created by a loss of cohesion in the self-joining polymer composition 20. Typically, a failure has a first face 61 and a second face 62, which opposes the first face 61. These faces may be rough or smooth surfaces. The faces may include a plurality of surfaces or faces. The discussion herein will be limited to two faces although the concept applies to more than two faces.

Amine pendant groups 32 dangling from the first face 61 are those amine pendant groups 31 dispersed throughout the polymer 21, which are exposed on the first face 61 of the failure 60 as the failure propagates into the self-joining polymer composition 20. The amine pendant groups 32 are reactable with flowable polymerizable material 50. Amine pendant groups 33 dangling from the second face 62 are those amine pendant groups 31 dispersed throughout the polymer 21 which are exposed on the second face 62 of the failure 60 as the failure propagates into the self-joining polymer composition 20. The amine pendant groups 33 are also reactable with flowable polymerizable material 50.

Figure 2:
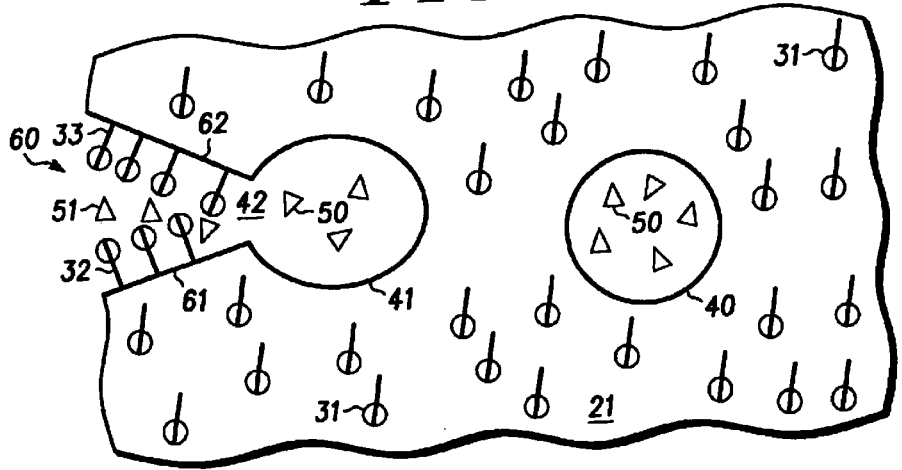

FIG. 2 illustrates the self-joining polymer composition 20 of FIG. 1 at a later time, when the failure 60 has propagated deeper into the self-joining polymer composition 20. The failure 60 has a first face 61 and a second face 62, which opposes the first face 61. Amine pendant groups 32 dangling from the first face 61 are those amine pendant groups 31 dispersed throughout the polymer 21, which are exposed on the first face 61 of the failure 60 as the failure propagates into the self-joining polymer composition 20. The amine pendant groups 32 are reactable with flowable polymerizable material 50 and 51. Amine pendant groups 33 dangling from the second face 62 are those amine pendant groups 31 dispersed throughout the polymer 21 which are exposed on the second face 62 of the failure 60 as the failure 60 propagates into the self-joining polymer composition 20. The amine pendant groups 33 are also reactable with flowable polymerizable material 50 and 51.

FIG. 2 illustrates a moment in time when the failure has intersected with one of the microcapsules 40 containing flowable polymerizable material 50. The microcapsule 40 can be designed to rupture upon intersection with a failure 60 as described in detail in commonly assigned U.S. patent application Ser. No. 10/195,858 filed Jul. 15, 2002 entitled "Self-Healing Polymer Compositions." The microcapsule shell may be comprised of several materials including hydrous metal oxide, silica, silicate, carbon, polymer, and mixtures thereof. The released flowable polymerizable material 51 from ruptured microcapsule 41 flows through the ruptured microcapsule opening 42 in the microcapsule 41 shell into the failure 60. Microcapsules 40 containing flowable polymerizable material 50 embedded in the self-joining polymer composition 20, which have not intersected with the fracture 60, will remain intact.

Figure 3:
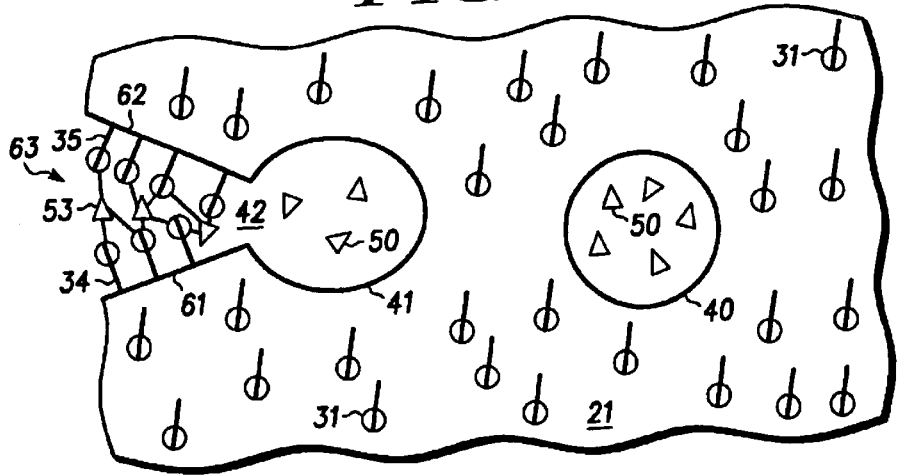
FIG. 3 illustrates schematically the material of FIG. 2 wherein the failure has been self-joined, in accordance with various embodiments of the invention.

FIG. 3 illustrates a moment in time after the released flowable polymerizable material 51 from ruptured microcapsule 41, which flowed through the ruptured microcapsule opening 42 in the microcapsule 41 shell into the failure 60, has bonded with the amine pendant groups 32 dangling from the first face 61 and the amine pendant groups 33 dangling from the second face 62. As in FIGS. 1 and 2, the self-joining polymer composition 20 comprised of a polymer 21, has a plurality of amine pendant groups 31 and a plurality of microcapsules 40 containing flowable polymerizable material 50 dispersed throughout the polymer. As illustrated in FIG. 3, the released flowable polymerizable material 51 (FIG. 2) has bonded to the reactable first face 61 dangling amine pendant groups 32 (FIG. 2) to form a reacted group 34 and the reactable second face 62 dangling amine pendant groups 33 (FIG. 2) to form a reacted group 35. Reacted group 34 and reacted group 35 are bonded to reacted polymerizable material 53. The failure 60 (FIG. 2) is now a self-joined failure 63.

The sequence of the bonding is variable, leading to the same result. A first end (see FIG. 5 and FIG. 7) of the released flowable polymerizable material 51 can bond with a reactable first face 61 dangling amine pendant group 34 before a second end (see FIG. 5 and FIG. 8) of the released flowable polymerizable material 51 bonds with a reactable second face 62 dangling amine pendant group 35. Or, the second end (see FIG. 5 and FIG. 8) of the released flowable polymerizable material 51 can bond with a second face 62 dangling amine pendant group 35 before the first end (see FIG. 5 and FIG. 8) of the released flowable polymerizable material 51 bonds with a first face 61 dangling amine pendant group 34. Or, both bonds can occur simultaneously. Since the released flowable polymerizable material 51 is a symmetric molecule the distinction between first and second end of the released flowable polymerizable material 51 is only brought out to describe the bonding events.

Figure 4:
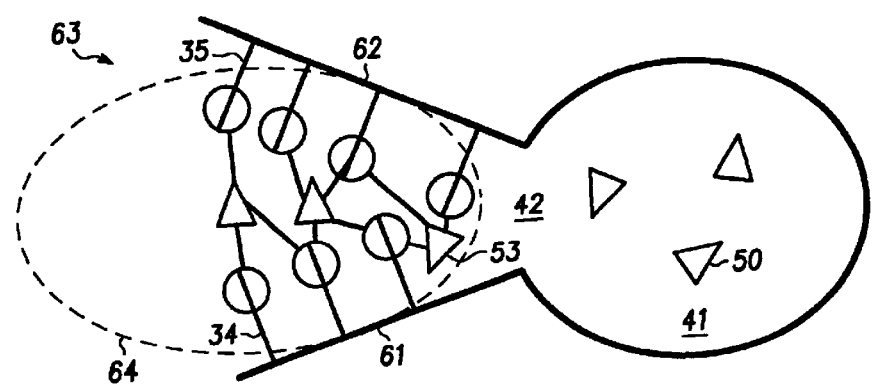
FIG. 4 illustrates an enlargement of the self-joined failure of FIG. 3.

FIG. 4 illustrates schematically, an expanded view of the self-joined failure 63, after the first end (see FIG. 5 and FIG. 7) of the reacted polymerizable material 53 has bonded with a first face 61 dangling amine pendant group 34 and the second end (see FIG. 5 and FIG. 8) of the released flowable polymerizable material 51 bonds with a second face 62 dangling amine pendant group 35 to form a cross-linked region 64 within the repaired or self-joined failure 63. The cross-link region will form a mesh-like web based on a link comprised of amine pendant group 34, bonded polymerizable material 53 and amine pendant group 35. The flowable polymerizable material 50 which flowed from the ruptured microcapsule 41 through the ruptured microcapsule opening 42 is now the reacted polymerizable material 53.

Figure 5:
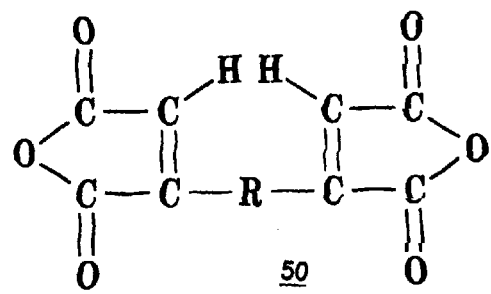
FIG. 5 illustrates a chemical structure of a polymerizing agent, in accordance with a first embodiment of the invention.

FIG. 5 illustrates the chemical structure for the formula of an exemplary polymerizing agent 50 in which 0 represents oxygen, C represents carbon and R represents a group of connecting atoms or chemical groups, typically several methylene groups, intended to give the polymerizing agent 50 lateral range for bonding crack faces 61 and 62 (see FIG. 1) as described below. This is the chemical structure of released flowable polymerizable material 51.

Figure 6:
FIG. 6 illustrates a chemical structure of a first amine pendant group, in accordance with a first embodiment of the invention.

FIG. 6 illustrates the chemical structure of an exemplary amine pendant group 31, which can be dispersed throughout the polymer 21 along with the plurality of microcapsules 40 containing flowable polymerizable material 50 to form the self-joining polymer composition 20 as illustrated in the previous figures. R' and R" represent either H atoms or different segments of the polymer 21 backbone with at least one of which comprising a segment of the polymer 21 backbone on the first face 61 of the failure 60 to which the pendant amine group 32 is attached while N and H represent nitrogen and hydrogen respectively. It should be noted that the amine functionality represented in FIG. 6 may be a part of the polymer composition 21 or the polymer composition 21 may be deliberately modified prior to formation of self-joining polymer composition 20.

Figure 7:
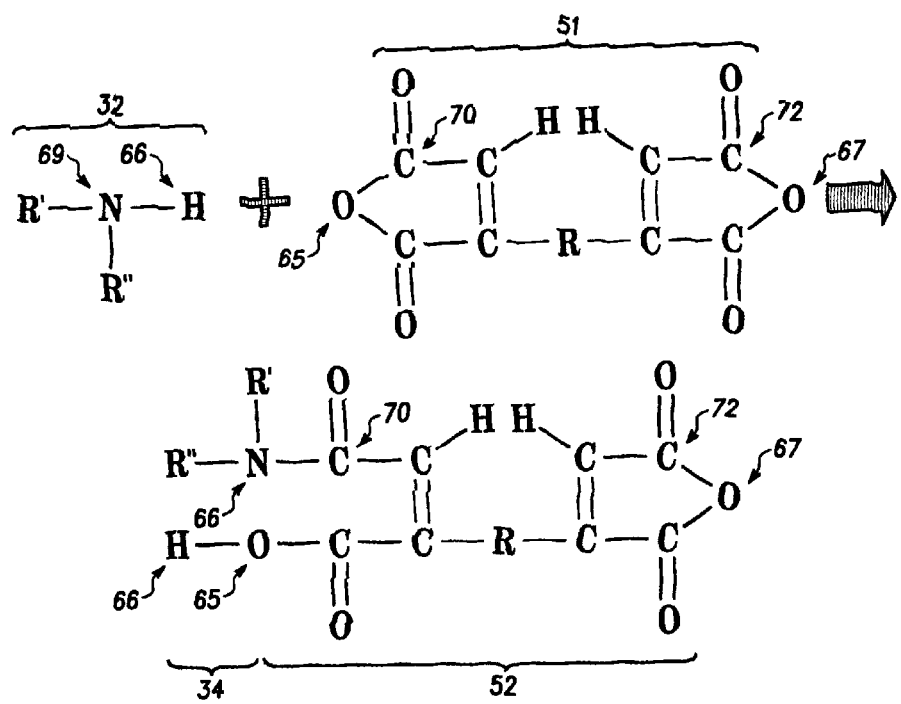
FIG. 7 illustrates a chemical structure of a first amine pendant group chemically bonded with the polymerizing agent in accordance with a first embodiment of the invention.
Figure 8:
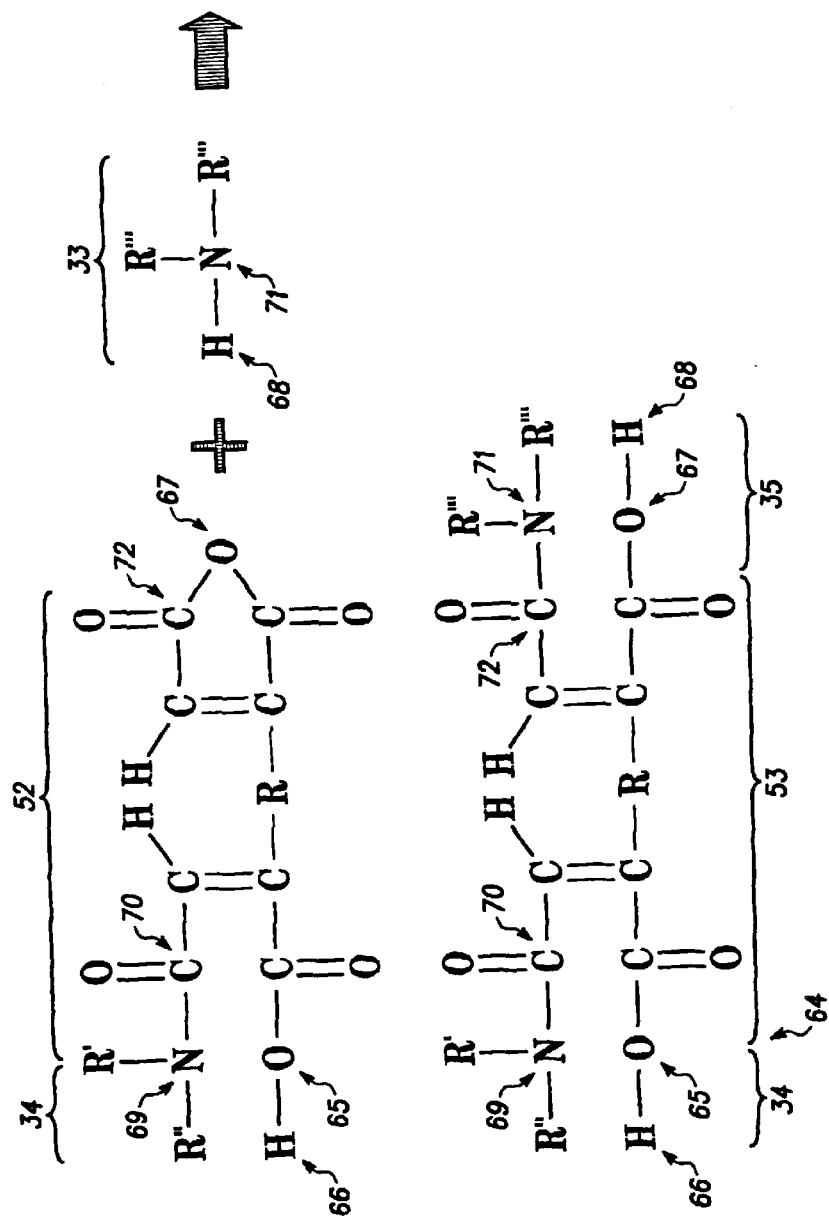
FIG. 8 illustrates the chemical structure of FIG. 7 chemically bonded to a second amine pendant group, in accordance with a first embodiment of the invention.

Chemical reactions described in FIGS. 7 and 8 are presented in the normal equation where the molecules, which will react, are shown to the left of the arrow and the chemical structure upon reaction is illustrated to the right of the arrow.

A first bonding event is illustrated in FIG. 7. One reactant is a reactable pendant amine group 32 bonded to two polymer backbones R' and R" of first face 61 at the nitrogen atom. The other reactant is released flowable polymerizable material 51. The segments labeled 34 and 52 show the chemical structure of the pendant amine group 34 attached to face one 61 two polymer backbones R' and R" and the first bonded polymerizable material 52 after the bonding reaction indicated by the arrow. Nitrogen atom 69 of the amine pendant group attached to polymerizable material 51 is now attached to the carbon atom 70 while the hydrogen 66 from the amine pendant group is attached to the oxygen atom 65 of released flowable polymerizable material 51. One skilled in the art will appreciate that the aforementioned reaction has formed an amide and a carboxylic acid from the acid anhydride reaction with the amine.

The second bonding event is illustrated in FIG. 8. The resultant chemical structure from the bonding illustrated in FIG. 7 and comprised of amine pendant group 34 and first bonded polymerizable material 52 is one reactant. The second face 62 dangling amine pendant group 33 attached to second face 62 of the failure 60 at polymer backbones R'" and R"" is the other reactant in the bonding event illustrated in FIG. 8. After the chemical bonding illustrated by the arrow the resultant link comprised of segments illustrated by amine pendant group 34 and bonded polymerizable material 53 and amine pendant group 35. This bonding event illustrated in FIG. 8 was due to oxygen 67 of the first bonded polymerizable material 52 being bonded to the hydrogen atom 68 of the amine pendant group 33 and the carbon atom 72 of first bonded polymerizable material 52 being bonded to the nitrogen atom 71 of the amine pendant group 33. One skilled in the art will appreciate that the aforementioned reaction has formed an amide and a carboxylic acid from the acid anhydride reaction with the amine. Within the failure 60, there are a plurality of such links formed, creating a net of chemical bonds between the first face 61 and the second face 62.

The described bonding is only one of many possible manners in which bonds can be established to form a cross-linking between face one 61 and face two 62 of failure 60. The illustrated embodiments of FIGS. 7 and 8 are meant to illustrate only one of many possible chemical bonding structures operable to form self-joining bonds 64 (FIG. 4) between a first face 61 and a second face 62 of a polymeric failure 60 (FIG. 4). By manufacturing articles from the described materials a manufactured article will be able to prevent cracks from propagating, allowing for a longer lifetime for the article. Structures can be manufactured from composite materials comprising the self-joining polymer composition 20 of FIG. 1. Such structures, such as aerospace vehicles, automotive parts, including body structures, sporting equipment and other structures requiring lightweight, high strength materials, will be self joining if a crack were to start from stresses on the structure and will have an extended lifetime.

Examples of other joining methods include formation of esters from anhydrides and alcohol polymer pendant groups, formation of esters from carboxylic acids and alcohol polymer pendant groups, formation of amides from carboxylic acids and amine pendant groups, formation of amides from amines and anhydride polymer pendant groups, formation of amides from amines and carboxylic acid polymer pendant groups, formation of esters from alcohols and anhydride polymer pendant groups, formation of esters from alcohols and carboxylic acid polymer pendant groups.

These illustrative embodiments are not intended to be exhaustive of all possibilities or to limit what materials can be used for the aforementioned purpose. There is, therefore, a multiplicity of other possible combinations and embodiments. By using what is shown and described herein, an automated self-joining of failures in polymers is possible, where the material strength upon self-joining is equivalent to the material strength of the original polymer prior to any failures. Those having ordinary skill in the art will therefore appreciate the benefit of employing an embodiment of this automated self-joining of failures in polymer compositions in a variety of devices, components and equipment comprised of polymers.

We claim:

1. A self-joining polymer composition, comprising:
   a polymer;
   a plurality of amine pendant groups attached to the polymer, the amine pendant groups being exposed on failure of the polymer; and
   a plurality of microcapsules of flowable polymerizable material dispersed in the polymer, the microcapsules of flowable polymerizable material including microcapsules and flowable polymerizable material inside the microcapsules, the microcapsules effective for ruprur-ing with the failure of the polymer and the flowable polymerizable material cross-linking with the reactable pendant groups upon rupture of the microcapsules.

2. The self-joining polymer composition of claim 1, wherein the plurality of reactable pendant groups are attached to a backbone of the polymer.

3. The self-joining polymer composition of claim 1, wherein the failure of the polymer comprises a crack having a first face and a second face, whereby the first face and the second face are opposing faces, wherein a first portion of the plurality of readable pendant groups is on the first face of the crack and a second portion of the plurality of reactable pendant groups is on the second face of the crack and wherein cross-links are formed between the first portion and the second portion reactable pendant groups creating cross-linking between the opposing faces of the crack.

4. The self-joining polymer composition of claim 1, wherein the microcapsule comprises a shell defining an interior space with the flowable polymerizable material disposed therein.

5. The self-joining polymer composition of claim 4, wherein the microcapsule shell comprises a material selected from the group consisting of hydrous metal oxide, silica, silicate, carbon, polymer, and combinations thereof.

6. The self-joining polymer composition of claim 1, wherein the flowable polymerizable material is selected from the group consisting of short and long chain dianhydrides and combinations thereof.

7. The self-joining polymer composition of claim 1, wherein the polymer is selected from the group consisting of epoxies, thermoset, thermoplastic, elastomeric, and combinations thereof.

8. The self-joining polymer composition of claim 3, wherein the first portion of reactable pendant groups on the first face are dangling from the first face and the second portion of reactable pendant groups on the second face are dangling from the second face.

9. The self-joining polymer composition of claim 8, wherein
the dangling from the first face comprises dangling from an attachment to a polymer backbone on the first face and
the dangling from the second face comprises dangling from an attachment to a polymer backbone on the second face.

10. The self-joining polymer composition of claim 9, wherein the formed cross-links form a mesh-like web based on links, the links comprising the first portion of reactable pendant groups, released flowable polymerizable material and the second portion of reactable pendant groups, whereby the formed mesh-like web is attached to the polymer backbone on the first face and to the polymer backbone on the second face.

11. The self-joining polymer composition of claim 1,
wherein the failure of the polymer comprises a crack having a fist face, a second face and a third face, whereby the first face and the second face a opposing faces, the second face and the third face are opposing faces and the first face and the third face are opposing faces,
wherein a first portion of the plurality of reactable pendant groups is on the first face of the crack and a second portion of the plurality of reactable pendant groups is on the second face of the crack and a third portion of the plurality of reactable pendant groups is on the third face of the crack, and
wherein cross-links are formed between the first portion and the second portion of reactable pendant groups, the second portion and third portion of reactable pendant groups, and the first portion and third portion of reactable pendant groups forming a cross-linking among all the opposing faces of the crack.

12. The self-joining polymer composition of claim 11, wherein the first portion of reactable pendant groups on the first face are dangling from the first face, the second portion of reactable pendant groups on the second face are dangling from the second face and the third portion of reactable pendant groups on the third face are dangling from the third face.

13. The self-joining polymer composition of claim 12, wherein
the dangling from the first face comprises dangling from an attachment to a polymer backbone on the first face,
the dangling from the second face comprises dangling from an attachment to a polymer backbone on the second face, and
the dangling from the third face comprises dangling, from an attachment to a polymer backbone on the third face.

14. The self-joining polymer composition of claim 13, wherein the formed cross-links form a mesh-like web based on links,
wherein the links are selected from the group consisting of
the first portion of reactable pendant groups, released flowable polymerizable material and the second portion of the plurality of reactable pendant groups,
the second portion of reactable pendant groups, released flowable polymerizable material and the third portion of the plurality of reactable pendant groups, and
the first portion of reactable pendant groups, released flowable polymerizable material and the third portion of the plurality of reactable pendant groups.

15. The self-joining polymer composition of claim 14, whereby the formed mesh-like web is attached to the polymer backbone on the fist face, the polymer backbone on the second face and the polymer backbone on the third face.

16. The self-joining polymer composition of claim 1, wherein the functionality of the plurality of amine pendant groups attached to the polymer is obtained by modification of the polymer prior to formation of the self-joining polymer composition.

17. A self-joining polymer composition, comprising:
means to form a mesh-like web attached to faces of a crack in the self-joining polymer.

18. The composition of claim 17, wherein the means to form a mesh-like web comprises:
means to provide a flowable polymerizable material;
means to provide a plurality of amine pendant groups attached to polymer backbones on opposing faces of a crack within the self-joining polymer; and
means to link the flowable polymerizable material with amine pendant groups on the opposing faces to form a mesh-like web between polymer backbones on faces of the crack.

19. A self-joining polymer composition, comprising:
means to provide a flowable polymerizable material;
means to provide a plurality of amine pendant groups attached to polymer backbones on opposing faces of a crack within the self-joining polymer; and
means to link the flowable polymerizable material with amine pendant groups on the opposing faces to form a mesh-like web between polymer backbones on faces of the crack.

* * * * *